(12) United States Patent
Knoedgen

(10) Patent No.: US 6,924,649 B2
(45) Date of Patent: Aug. 2, 2005

(54) SENSOR READ OUT

(75) Inventor: Horst Knoedgen, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 133 days.

(21) Appl. No.: 10/371,742

(22) Filed: Feb. 20, 2003

(65) Prior Publication Data
US 2004/0155663 A1 Aug. 12, 2004

(30) Foreign Application Priority Data
Feb. 12, 2003 (EP) .............................................. 03368013

(51) Int. Cl.⁷ .......................... G01R 31/08; H03F 3/45; G01K 7/16
(52) U.S. Cl. ........................ 324/525; 330/257; 702/133
(58) Field of Search ................................. 324/525, 512, 324/500, 549, 651, 691, 451, 526, 510; 327/124, 307; 330/9, 257, 258; 702/65, 47, 53, 57, 133; 73/628, 862; 338/20

(56) References Cited
U.S. PATENT DOCUMENTS

| 4,864,513 | A | | 9/1989 | Levine et al. ............... 364/482 |
|---|---|---|---|---|
| 5,116,136 | A | * | 5/1992 | Newman et al. ............. 374/102 |
| 5,247,680 | A | | 9/1993 | Huber .......................... 395/800 |
| 5,444,579 | A | * | 8/1995 | Klein et al. .................... 360/67 |
| 5,786,808 | A | | 7/1998 | Khoury ....................... 345/161 |
| 6,181,141 | B1 | * | 1/2001 | Juntunen et al. ............. 324/525 |
| 6,538,503 | B2 | * | 3/2003 | Burt ............................... 330/9 |
| 6,768,318 | B2 | * | 7/2004 | Burt et al. .................... 324/651 |
| 6,801,059 | B2 | * | 10/2004 | Lee .............................. 327/65 |

* cited by examiner

Primary Examiner—Edward Lefkowitz
Assistant Examiner—Hoai-An D. Nguyen
(74) Attorney, Agent, or Firm—George O. Saile; Stephen B. Ackerman

(57) ABSTRACT

A circuit and a method to measure continuously the resistance of variable resistors in series as e.g. potentiometers within a sensor, used for e.g. a joystick, has been achieved. The voltage across said sensor comprising any number of variable resistors is stabilized. A constant current source is providing a minimum current through said sensor. A variable current source is used to zoom variations of current through the sensor caused by variations of resistance of the sensor. Said variable current is mirrored and by measuring the voltage across a shunt resistor the total resistance of the sensor is identified. Using ports between each of the resistors, voltages can be measured representing the resistance of each of the variable resistors using known equations of voltage dividers. Any number of variable resistors can be used in the circuit invented.

20 Claims, 3 Drawing Sheets

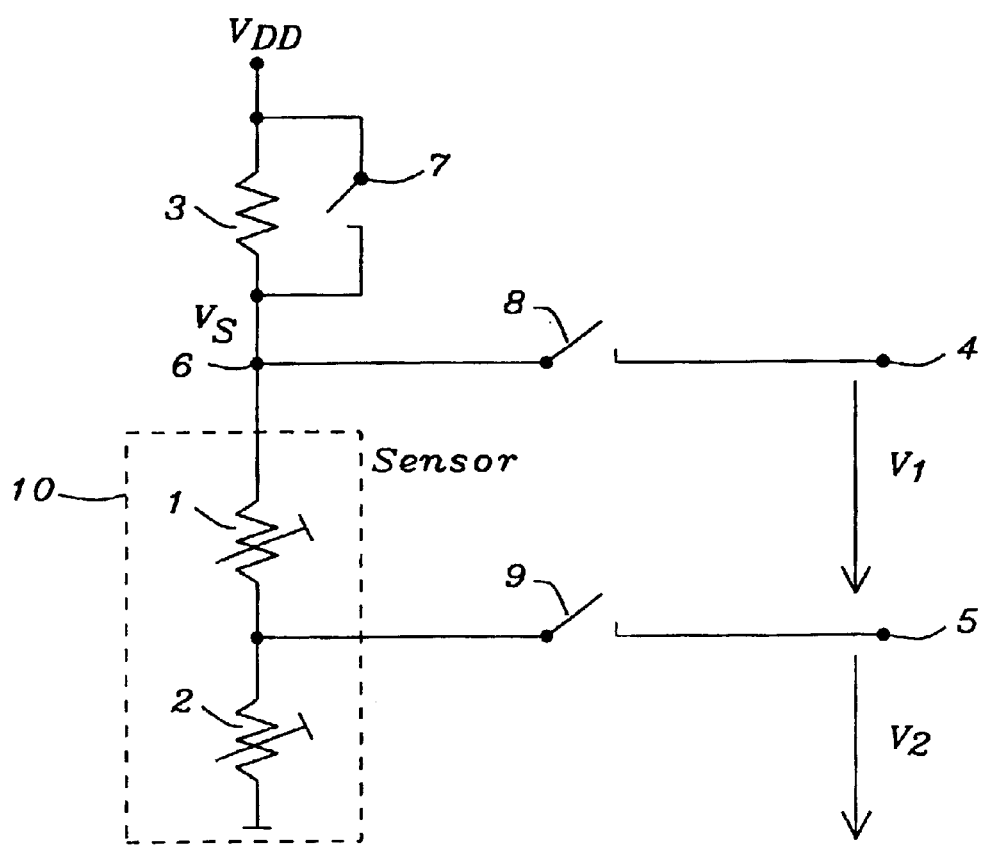
FIG. 1 – Prior Art

SENSOR READ OUT

BACKGROUND OF THE INVENTION

(1) Field of the Invention

This invention relates generally to the area of reading out electronic sensors, and more particular, to sensors having variable resistance as e.g. potentiometers.

(2) Description of the Prior Art

One of the most convenient and inexpensive transducer is a potentiometer. A potentiometer is essentially a device, which can be configured so that a continuously variable voltage is produced that is proportional to the potentiometer's shaft position.

One of the applications of potentiometers is the usage as an analog input device in combination with devices as a joystick. A joystick position is determined by reading the resistance value of a potentiometer attached to the joystick. Potentiometers are a simple and very inexpensive system and can be designed to interface to a standard computer interface. Potentiometers can use a desktop as a position reference, and a joystick is usually suction or non-skid mounted to the desktop to prevent sliding.

Two potentiometers are required to define a position in a two-dimensional space. FIG. 1 prior art shows a typical implementation of a circuit having a sensor 10 comprising two potentiometers 1 and 2, a shunt resistor 3, a supply voltage $V_{dd}$, a port 4 to measure the voltage representing the total resistance of the two potentiometers 1 and 2 and a port 5 to measure the voltages representing the resistance values of said potentiometers 1 and 2. The potentiometers 1 and 2 are acting as a voltage divider. The voltage Vs 6 is the entry voltage of the potentiometers 1 and 2. In order to get the resistance of each potentiometer the sum of the resistance Z of both the potentiometers 1 and 2 must be known:

$$Z = R_1 + R_2,$$

wherein $R_1$ is the variable resistance of potentiometer 1 and $R_2$ is the variable resistance of potentiometer 2. The value of Z is measured by opening the switches 7 and 9 and closing switch 8. The total resistance of both potentiometers 1 and 2 calculates $$Z = \frac{V_s \times R_3}{V_{dd} - V_s}$$

wherein $V_s$ is the voltage measured at port 4 and $R_3$ is the known constant resistance of the resistor 3.

An additional switch 9 is required to measure the resistance of the potentiometers 1 and 2. For this measurement switch 7 is closed to have the complete voltage $V_{dd}$ available for the maximum signal. Therefore $V_s$ equals $V_{dd}$ while switch 7 is closed.

The voltage $V_1$ comprises the difference between the entry voltages of the sensor Vs 6 (in this case $V_s$ equals $V_{dd}$) to the voltage measured at the output port 5.

$$V_1 = \frac{R_1}{Z} \times V_s \text{ or } R_1 = \frac{V_1 \times Z}{V_s},$$

wherein $R_1$ is the resistance of the potentiometer 1.

The voltage $V_2$ comprises the voltage level measured at the output port 5.

$$V_2 = \frac{R_2}{Z} \times V_s \text{ or } R_2 = \frac{V_2 \times Z}{V_s},$$

wherein $R_2$ is the resistance of the potentiometer 2.

There are various problems linked to this prior art approach. There is no continuous measurement of the resistance of $R_1$, $R_2$ and of the total resistance Z possible. There are two time slots required to measure first the total resistance Z and secondly the resistance of each potentiometer. For a following analog-to-digital converter the time slots available are very short to convert the voltage values measured at port 5 and at port 4 and that will increase the noise to signal ratio. The voltage modulation of the voltages measured at port 4 and 5 is huge and therefore the time constant of a filter is quite limited.

Additionally for the measurement of the total resistance Z the signals are quite small because the voltage has to be divided between the sensor 10 and the resistor 3.

U.S. Pat. No. (4,864,513 to Levine et al.) describes a technique for forming a signal representing the operator adjustment of a potentiometer. This technique consists of measuring the reference time constant of the resistance between the fixed terminals of the potentiometer and a capacitor, measuring the variable time constant of the resistance of the potentiometer between a fixed terminal and the terminal variable by an operator setting and this same capacitor, and again measuring the reference time constant of the resistance between the fixed terminals of the potentiometer and the capacitor. These time constant measurements are made by discharging the capacitor, charging the capacitor through the appropriate terminal of the potentiometer and measuring the time required for the voltage across the capacitor to reach a predetermined threshold level.

U.S. Pat. No. (5,247,680 to Huber) discloses a circuit including an adjustment control (e.g. a potentiometer) that has two end connections and a slider that is adjustable for setting different resistance ratios. The two end connections of the potentiometer are each connected to one of two connections of a microprocessor and the slider is connected to one connection of a capacitor. The other capacitor connection is connected to a predetermined potential. To each of the two microprocessor connections at least one controllable switch is connected for optionally connecting a first potential or a second potential to the relevant microprocessor connection. The microprocessor executes a program run in which the capacitor that has previously been brought into an initial charge state is recharged first via one resistance section and then via the other resistance section of the potentiometer. In each case a measurement value Z corresponding to a capacitor-recharging period is determined and from the determined measurement values Z a digital data word signal is generated by forming the quotient thereof. This digital signal represents the resistance ratio set by the slider of the potentiometer.

U.S. Pat. No. (5,786,808 to Khoury) describes a digital positioning system for a joystick. The system uses a potentiometer having one input coupled to a constant supply voltage and a second input coupled to a joystick game port for generating a variable resistance representative of a current position of the joystick. A constant current source is coupled to the joystick game port for generating a current for converting the variable resistance representative of the current position of the joystick to a voltage level representative of the current position of the joystick. An analog-to-digital converter circuit is coupled to the joystick game port and is used to convert the voltage level representative of the current position of the joystick to a digital representation of the current position of the joystick.

SUMMARY OF THE INVENTION

A principal object of the present invention is to achieve a circuit and a method to measure continuously the resistance of variable resistors in a sensor.

In accordance with the object of the invention a circuit to measure continuously the resistance of variable resistors in a sensor has been achieved. Said circuit comprises first a sensor comprising more than one variable resistors in series and one or more output ports providing signals identifying the variable resistance of each of said variable resistors. Furthermore said circuit comprises a means of a constant current source providing a part of the current flowing through said sensor comprising variable resistors, a means of a variable current source for the remaining part of the current flowing through said sensor to adapt to variations of resistance of said sensor, a means of stabilizing the voltage across said sensor and a means to mirror said variable current. Furthermore said circuit comprises a means of stabilizing the voltage across said current mirror and means to use said mirrored current to identify the total resistance of said sensor.

Furthermore in accordance with the object of the invention a method to measure continuously the resistance of variable resistors in a sensor has been achieved. Said method comprises first providing a sensor comprising more than one variable resistors in series and one or more output ports providing signals identifying the variable resistance of each of said variable resistors, a means of a constant current source providing a part of the current flowing through said sensor comprising variable resistors, a means of a variable current source for the remaining part of the current flowing through said sensor to adapt to variations of resistance of said sensor, a means of stabilizing the voltage across said sensor, a means to mirror said variable current, a means of stabilizing the voltage across said current mirror, and a means to use said mirrored current to identify the total resistance of said sensor. Furthermore said method comprises stabilizing the voltage across said sensor, providing a constant current flowing through the sensor, providing a variable current flowing through the sensor to cover variations of resistance of said sensor, mirroring said variable current representing variations of the resistance of the sensor, identifying the total resistance of the sensor by measuring the voltage of said mirrored current across a known shunt resistor, and identifying the resistance of each variable resistor within the sensor by representing voltages.

BRIEF DESCRIPTION OF THE DRAWINGS

In the accompanying drawings forming a material part of this description, there is shown:

FIG. 1 prior art illustrates a circuit to measure the resistance of variable resistors within a sensor.

DESCRIPTION OF THE PREFERRED EMBODIMENTS

The preferred embodiment disclose a method and a circuit capable to measure continuously the variable resistance of resistors as being used e.g. in combination with joysticks.

Figure 2A:
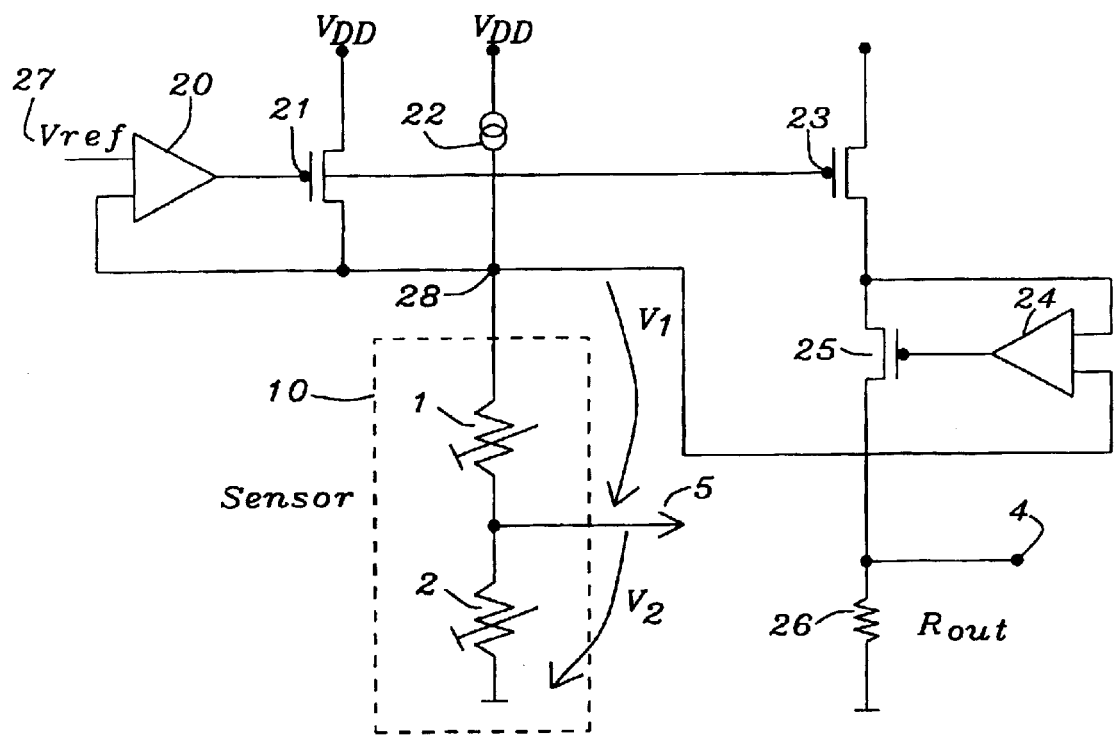
FIG. 2A shows a circuit invented for continuous measurement of the resistance of variable resistors in a sensor.

FIG. 2A shows a schematic of the circuit invented. The voltage across the sensor 10 is stabilized. This is performed by the amplifier 20 and the transistor 21 using a reference voltage 27. The constant current source 22 is only required to zoom out the variations of the resistance Z of the sensor 10 and is providing a constant part of the current flowing through said sensor 10. Said sensor 10 comprises two variable resistors 1 and 2.

For example, if the current flowing through the sensor is 1 mA and the current source 22 is providing a constant current of 950 $\mu$A, a current of only 50 $\mu$A will flow through transistor 21. In case the current through said sensor 10 increases by 10 $\mu$A, said current through transistor 21 will increase subsequently from 50$\mu$ to 60 $\mu$A. This is a change of 20%. Without the constant current source 22 the current through transistor 21 would increase from 1000 $\mu$A to 1010$\mu$. This is a change of 1% only compared to the 20% increase we have achieved by using the constant current source 22.

The transistor 23 has the function of a mirror of transistor 21. The amplifier 24 is stabilizing together with transistor 25 the voltage across transistor 23. Said voltage across transistor 23 has to have the same value as the voltage across transistor 21. This identity of voltage levels is a prerequisite that the currents through transistors 21 and 23 are not dependent on said voltage levels. The amount of current flowing through resistor 26 equals the amount of current flowing through the sensor 10 minus the current provided by the constant current source 22. Using the above-mentioned example, if a current of 1000 $\mu$A is flowing through sensor 10 and the current source 22 is providing 950 $\mu$A, a current of 50 $\mu$A will flow through resistor 26. The value of the total resistance Z of sensor 10 can be therefore identified by measuring the voltage level at gate 4. By said zooming effect of the current source 22 a high voltage scale is achieved to identify even small variations of the total resistance Z of the sensor 10.

The entry voltage level of the sensor 10 is signified by the voltage $V_s$ 28. For example said voltage $V_s$ can be 300 to 500 mV below $V_{dd}$ depending upon the precision of the regulator comprising the amplifier 20 and transistor 21.

The variable resistance of the resistors 1 and 2 can be identified by measuring the voltage at port 5. The resistance of said variable resistors 1 and 2 can be calculated according to the equations shown in the prior art section:

$$V1 = \frac{R_1}{Z} \times V_s \text{ or } R_1 = \frac{V_1 \times Z}{V_s},$$

wherein $R_1$ is the resistance of the variable resistor 1, $V_s$ is the entry voltage 28 of the sensor 10 and $V_1$ is the difference of voltage between said entry voltage VS and the voltage measured at port 5. The resistance of the variable resistor 2 can be measured accordingly The voltage $V_2$ comprises the voltage level measured at the output port 5.

$$V_2 = \frac{R_2}{Z} \times V_s \text{ or } R_2 = \frac{V_2 \times Z}{V_s},$$

wherein $R_2$ is the resistance of the potentiometer 2.

The advantage of the circuit invented is first, that the measurement of the resistance of each potentiometer and of the total resistance of the sensor 10 can be done continuously, no modulation is required any more and second that the signal representing the total resistance of the sensor is much bigger compared to prior art and has got a much better scale.

Figure 2B:
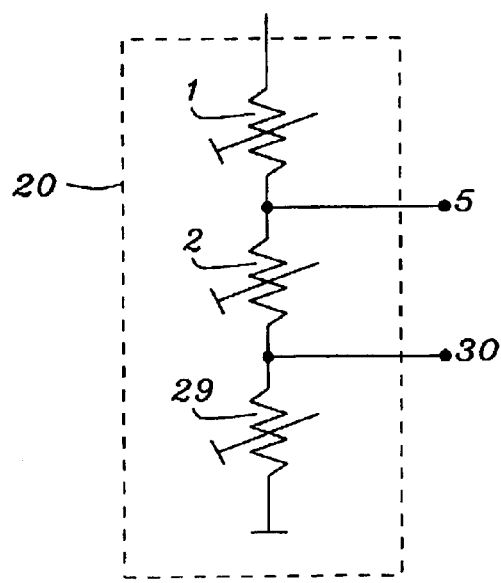
FIG. 2B shows a sensor having more than two variable resistors and the related output ports.

FIG. 2B illustrates another embodiment of a sensor 20. Now three potentiometers 1, 2, and 29 are being used to handle an additional input parameter. The resistance of the additional potentiometer 29 is identified by measuring the voltage of the additional port 30. All the other components of the circuit as shown in FIG. 2A remain the same. The total resistance Z of the sensor 20 can be measured by measuring the voltage level at port 4 as shown in FIG. 2A.

For those skilled in art it is obvious that with the circuit invented any number of input parameters can be handled using additional potentiometers and additional output ports.

Figure 3:
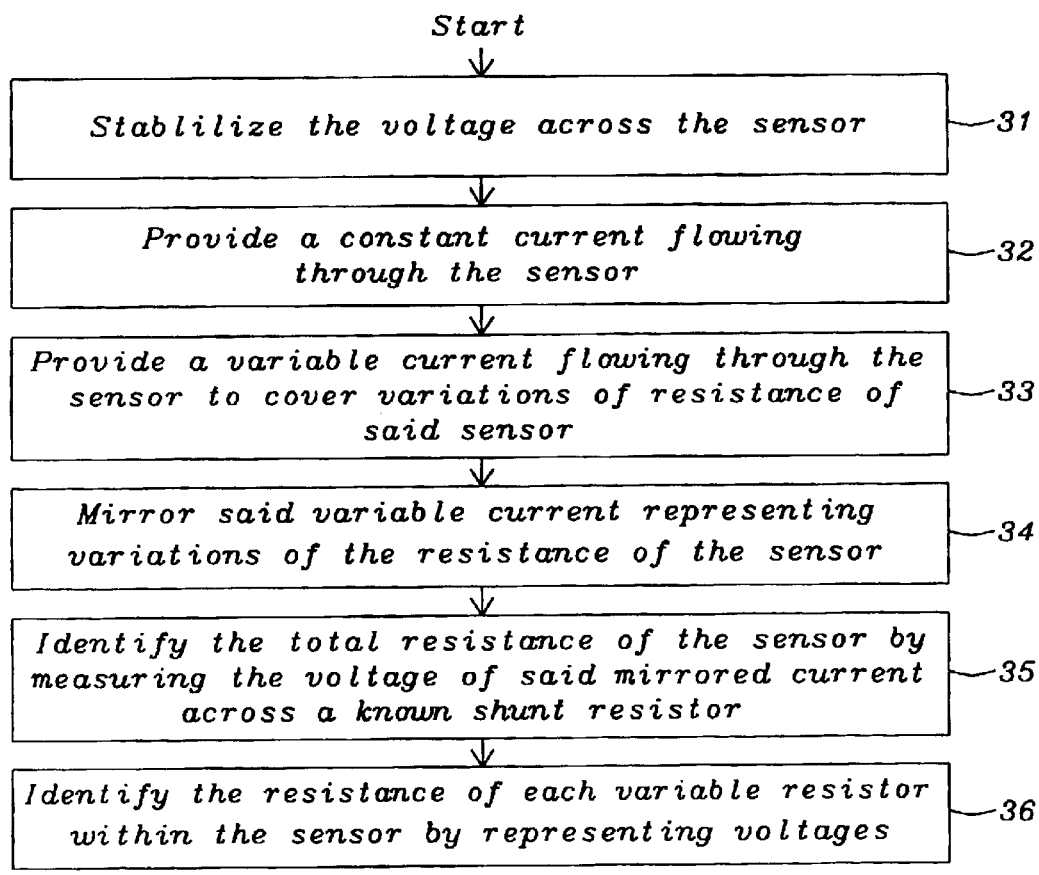
FIG. 3 shows a flowchart of the method invented.

FIG. 3 illustrates a method how to achieve a continuous measurement of the total resistance of a sensor and of the resistance of each of the variable resistors. The first step 31 shows the stabilization of the voltage across the sensor, followed by step 32 illustrating that a constant current is provided through the sensor. Step 33 shows another variable current is provided flowing through the sensor to cover variations of the resistance of said sensor. In step 34 said variable current is mirrored. Step 35 describes that the resistance of the sensor is identified by measuring the voltage level of said mirrored current across a known shunt resistor. In step 36 the resistance of each variable resistor located in the sensor is identified by measuring representative voltages.

While the invention has been particularly shown and described with reference to the preferred embodiments thereof, it will be understood by those skilled in the art that various changes in form and details may be made without departing from the spirit and scope of the invention.

What is claimed is:

1. A circuit to measure continuously the resistance of variable resistors in a sensor comprising:
    a sensor comprising more than one variable resistor in series and one or more output ports providing signals identifying the variable resistance of each of said variable resistors;
    a means of a constant current source providing a part of the current flowing through said sensor comprising variable resistors;
    a means of a variable current source for the remaining part of the current flowing through said sensor to adapt variations of resistance of said sensor;
    a means of stabilizing the voltage across said sensor;
    a means to mirror said variable current;
    a means of stabilizing the voltage across said current mirror; and
    a means to use said mirrored current to identify the total resistance of said sensor.

2. The circuit of claim 1 wherein said means of stabilizing the voltage across said sensor is an amplifier having an input and an output wherein the input is a reference voltage and the entry voltage of said sensor and the output is linked to said means of a variable current source.

3. The circuit of claim 1 wherein said means of a variable current source is a transistor whose base is linked to said means of stabilizing the voltage across the sensor and which is linked to a supply voltage and to the entry point of said sensor.

4. The circuit of claim 1 wherein said variable resistors are potentiometers.

5. The circuit of claim 1 wherein said part of current provided by said means of a constant current source is equivalent to a current flow if the resistance of said sensor has its possible maximum.

6. The circuit of claim 1 wherein said means to mirror said variable current is transistor whose base is connected to said means of a variable current source providing said variable current to said sensor and which is linked to a supply voltage and to said means to stabilize the voltage across said current mirror.

7. The circuit of claim 1 wherein said means of stabilizing the voltage across said current mirror is an amplifier having inputs and an output wherein a first input is linked to said means to mirror said variable current and a second input is linked to the entry voltage of said sensor and the output is linked to the base of an transistor controlling the flow of said mirrored current.

8. The circuit of claim 1 wherein said means to use said mirrored current to identify the total resistance of said sensor is a resistor located in the flow of said mirrored current and wherein the voltage across said resistor can be used to identify said total resistance.

9. The circuit of claim 1 wherein said sensor comprises two variable resistors in series and one port between said two variable resistors to measure a voltage representing the resistance of each of said two variable resistors.

10. The circuit of claim 1 wherein said sensor comprises any number n variable resistors in series and n-1 ports in between each of said variable resistors to measure voltages representing the resistance of each of said variable resistors.

11. A method to measure continuously the resistance of variable resistors in a sensor comprising:
    providing a sensor comprising more than one variable resistors in series and one or more output ports providing signals identifying the variable resistance of each of said variable resistors, a means of a constant current source providing a part of the current flowing through said sensor comprising variable resistors, a means of stabilizing the voltage across said sensor, a means of a variable current source for another part of the current flowing through said sensor to adapt variations of resistance of said sensor, a means to mirror said variable current, a means of stabilizing the voltage across said current mirror, and a means to use said mirrored current to identify the total resistance of said sensor;
    stabilize the voltage across said sensor;
    provide a constant part of the current flowing through the sensor;
    provide a variable current source for the remaining part of the current flowing through the sensor to cover variations of resistance of said sensor;
    mirror said variable current representing variations of the resistance of the sensor;
    identify the total resistance of the sensor by measuring the voltage of said mirrored current across a known shunt resistor; and
    identify the resistance of each variable resistor within the sensor by representing voltages.

12. The method of claim 11 wherein said means of stabilizing the voltage across said sensor is an amplifier having an input and an output wherein the input is a reference voltage and the entry voltage of said sensor and the output is linked to said means of a variable current source.

13. The method of claim 11 wherein said means of a variable current source is a transistor whose base is linked to said means of stabilizing the voltage across the sensor and which is linked to a supply voltage and to the entry point of said sensor.

14. The method of claim 11 wherein said variable resistors are potentiometers.

15. The method of claim 11 wherein said part of current provided by said means of a constant current source is equivalent to a current flow if the resistance of said sensor has its possible maximum.

16. The method of claim 11 wherein said means to mirror said variable current is transistor whose base is connected to said means of a variable current source providing said variable current to said sensor and which is linked to a supply voltage and to said means to stabilize the voltage across said current mirror.

17. The method of claim 11 wherein said means of stabilizing the voltage across said current mirror is an amplifier having inputs and an output wherein a first input is linked to said means to mirror said variable current and second input is linked to the entry voltage of said sensor and the output is linked to the base of transistor controlling the flow of said mirrored current.

18. The method of claim 11 wherein said means to use said mirrored current to identify the total resistance of said sensor is a resistor located in the flow of said mirrored current and wherein the voltage across said resistor can be used to identify said total resistance.

19. The method of claim 11 wherein said sensor comprises two variable resistors in series and one port between said two variable resistors to measure a voltage representing the resistance of each of said two variable resistors.

20. The method of claim 11 wherein said sensor comprises any number n variable resistors in series and n-1 ports in between each of said variable resistors to measure voltages representing the resistance of each of said variable resistors.

* * * * *